(12) United States Patent
Martin et al.

(10) Patent No.: US 8,712,358 B2
(45) Date of Patent: Apr. 29, 2014

(54) RECEPTION SYSTEM INCLUDING A MECHANISM COUNTERING PULSED INTERFERENCE

(75) Inventors: Nicolas Martin, Bourg les Valence (FR); Jean-Michel Perre, St Peray (FR); David Depraz, Valence (FR)

(73) Assignee: THALES, Neuilly sur Seine (FR)

(*) Notice: Subject to any disclaimer, the term of this patent is extended or adjusted under 35 U.S.C. 154(b) by 0 days.

(21) Appl. No.: 13/492,414

(22) Filed: Jun. 8, 2012

(65) Prior Publication Data

US 2013/0090079 A1    Apr. 11, 2013

(30) Foreign Application Priority Data

Jun. 10, 2011    (FR) .................... 11 01781

(51) Int. Cl.
*H04B 1/10*    (2006.01)
(52) U.S. Cl.
USPC ............. 455/234.1; 455/250.1; 375/345
(58) Field of Classification Search
USPC .......... 455/226.1, 226.2, 232.1, 234.1, 234.2, 455/239.1, 245.1, 249.1, 251, 254, 250.1; 375/345

See application file for complete search history.

(56) References Cited

U.S. PATENT DOCUMENTS

| 7,295,517 B2* | 11/2007 | Anim-Appiah et al. ...... 375/345 |
| 8,135,054 B2* | 3/2012 | Kirby et al. ................ 455/234.1 |
| 2002/0061738 A1* | 5/2002 | Simmons et al. .......... 455/234.1 |
| 2006/0176985 A1 | 8/2006 | Tandon et al. |

OTHER PUBLICATIONS

Search Report issued in corresponding French Patent Application No. 1101781 on Feb. 2, 2012.

* cited by examiner

*Primary Examiner* — Thanh Le
(74) *Attorney, Agent, or Firm* — Baker Hostetler LLP

(57) ABSTRACT

A system for receiving an analogue signal e includes amplifying and digitizing the signal in order to obtain a digitized signal $e_n$, a power inversion module, the module determining an inversion gain $g_2$, this gain being applied to the digitized signal $e_n$, an automatic gain control AGC loop adapting the power of the signal e before digitization, the input signal of the AGC loop being a function of the inversion gain $g_2$.

8 Claims, 3 Drawing Sheets

RECEPTION SYSTEM INCLUDING A MECHANISM COUNTERING PULSED INTERFERENCE

CROSS-REFERENCE TO RELATED APPLICATIONS

This application claims priority to foreign French patent application No. FR 11 01781, filed on Jun. 10, 2011, the disclosure of which is incorporated by reference in its entirety.

FIELD OF THE INVENTION

The invention relates to a reception system including a mechanism countering pulsed interference. It applies notably to the field of digital-analogue conversion for radionavigation.

BACKGROUND

In a digital radionavigation reception system, the demodulation of the signals is performed in digital mode. Before performing this demodulation, an analogue stage of the receiver reduces the signal to around an intermediate frequency. Another function of this analogue stage is to amplify the signal and to filter it using an anti-aliasing filter. After filtering, the signal is digitized by using an analogue-digital converter, usually designated by the acronym ADC. In order to control the gain of the analogue subsystem so as to have a maximum efficiency of the ADC converter, an adaptive gain control AGC loop, also called automatic gain control loop, is usually used.

Furthermore, for certain applications, the digital radionavigation reception system has to take account of the fact that the analogue signals received include a useful part from which the digital data can be obtained, but also interference. As an example, it is planned for the future GNSS (Global Navigation Satellite System) satellite navigation systems, such as the modernized GPS and the Galileo system, to use frequency bands already used for civil aviation. For example, the band L5 can be used to receive the frequencies of the VOR/DME (Very Omni-Range/Distance Measurement Equipment) systems. To these frequencies, interferences are therefore introduced that can affect the correct operation of GNSS signal reception systems. These interferences consist of pulses which are of short duration, but powerful and frequent, and are able to prevent good reception of the GNSS signals.

In order to reduce the impact of these interferences, a known interference suppression technique, usually referred to as "blanking" can be used. This technique consists in zeroing the signal received when an excessively high power level is detected. This power level reflects the presence of interference pulses, also called pulsed interference. After suppression, only the portions of the signal received without pulsed interference remain, said portions normally being sufficient to demodulate the GNSS signal and enable navigation. Hereinafter in the description, reference is made to this technique by using the expression "temporary signal cancellation".

In order to implement the temporary signal cancellation technique, a fixed threshold has to be selected on the estimated power level, beyond which the signal is cancelled. The role of the AGC loop is then to maintain an optimum signal level relative to this threshold. The AGC loop usually uses a power measurement as input. When the temporary signal cancellation technique is used, the power measurement for the AGC loop is usually implemented after this processing operation. Thus, the power measurement is not disturbed by the interferences.

One drawback is that the reception system may diverge in the presence of inferences. This is because, when the interferences resulting in a cancellation of the signal are numerous, the average power measured at the input of the AGC loop decreases artificially. This causes the AGC loop to react, said loop increasing the value of the analogue gain $g_a$ used to control the power of the signal at the input of the ADC converter. The amplitude of the signal at the input of the module responsible for implementing the temporary signal cancellation is then greater relative to the predefined cancellation threshold. The signal received is then zeroed even more frequently and the AGC loop diverges, rendering the demodulation of the radionavigation signal impossible.

SUMMARY

One aim of the invention is notably to overcome the above-mentioned drawbacks.

To this end, the subject of the invention is a system for receiving an analogue signal e. The system comprises means for amplifying and digitizing said signal in order to obtain a digitized signal $e_n$; a power inversion module, said module determining an inversion gain $g_2$, this gain being applied to the digitized signal $e_n$; an automatic gain control AGC loop adapting the power of the signal e before digitization. The input signal of the AGC loop is a function of the inversion gain $g_2$.

In one embodiment, the input signal of the AGC loop is the signal $e_i$ obtained after application of the inversion gain $g_2$.

In another embodiment, the input signal of the AGC loop is the power inversion gain $g_2$ determined by the inversion module.

The system is, for example, configured to receive satellite signals of GNSS type.

According to one aspect of the invention, the inversion module estimates the power of the digitized signal $e_n$, filters the estimated power, inverts the filtered estimated power in order to obtain the gain $g_2$ applied to the digitized signal $e_n$.

According to another aspect of the invention, the inversion gain $g_2$ is applied to a delayed version of the digitized signal $e_n$, said signal being delayed in order to compensate the delay introduced by the filtering.

The inversion relationship between the filtered estimated power of the digitized signal $e_n$ and the inversion gain $g_2$ may differ according to the measured values of the power $e_n$.

In one embodiment, for a first range of power values, a first profile of inversion gain $g_2$ is used and for a second range of power values, a second profile of inversion gain $g_2$ is used.

BRIEF DESCRIPTION OF THE DRAWINGS

Other features and advantages of the invention will become apparent from the following description, given as a nonlimiting illustration, and in light of the appended drawings in which.

DETAILED DESCRIPTION

Figure 1:
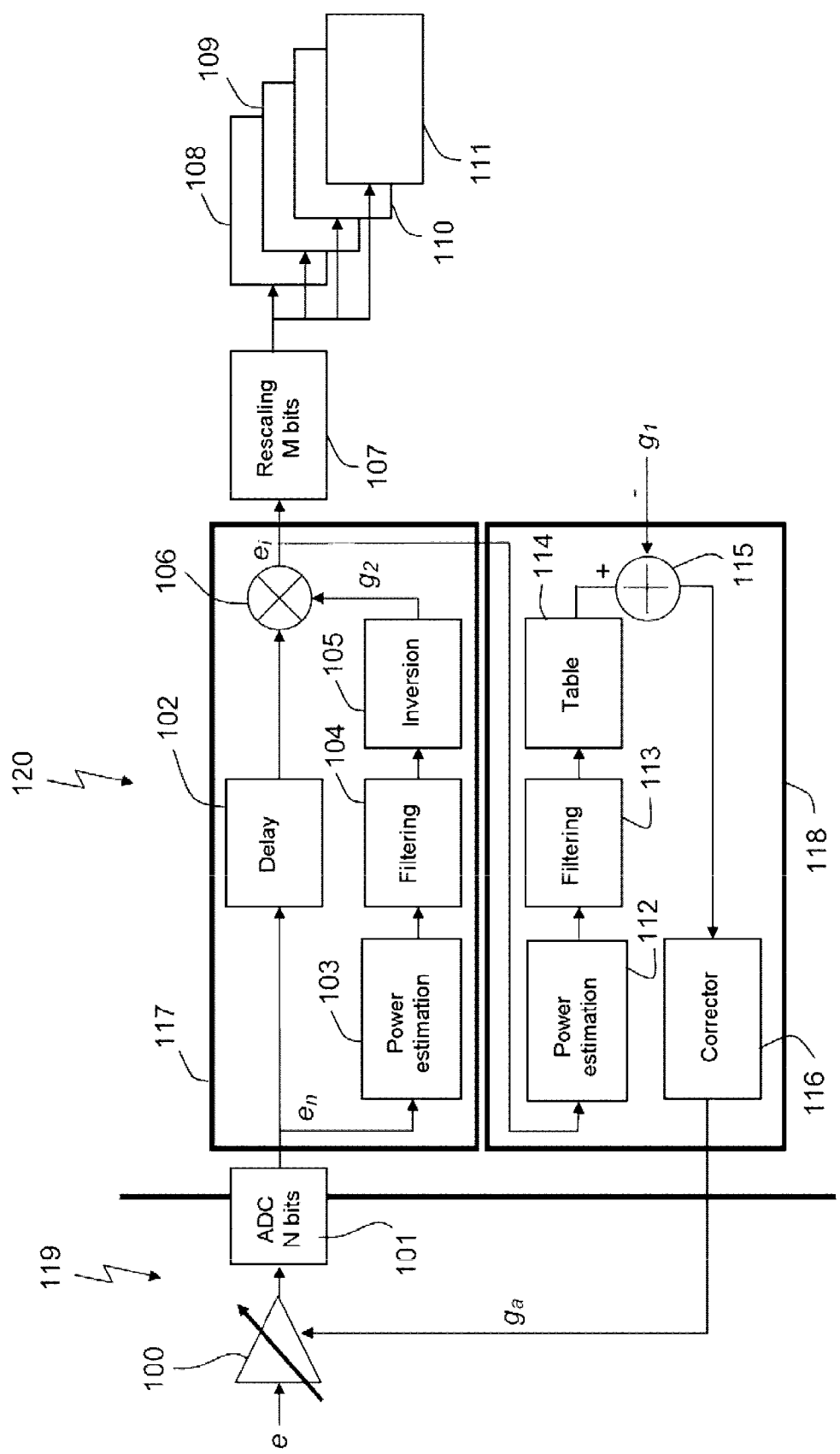
FIG. 1 illustrates a first embodiment of the reception system according to the invention.

FIG. 1 illustrates a first embodiment of the reception system according to the invention. In this embodiment, the processing operations performed by the system are divided into two stages, an analogue stage 119 and a digital stage 120. The analogue stage 119 notably comprises a variable gain amplifier 100, whose function is to amplify an input analogue signal e. After amplification, the signal is introduced into an N-bit ADC converter 101. The digitized signal $e_n$ corresponds to a succession of digital samples coded on N bits.

The system according to the invention comprises a power inversion module 117, the function of which is to reduce the impact of the pulsed interferences on the signal to be demodulated. For this, the power of the digitized signal $e_n$ is estimated 103. This power estimation 103 is performed, for example, by squaring the samples of the signal $e_n$. The estimated power is then filtered 104 by using, for example, a sliding window filter. The estimated and filtered power is then inverted 105 by using, for example, a mapping table in order to produce an inversion gain $g_2$. This gain $g_2$ is applied 106 to a delayed version of the digitized signal $e_n$, said signal being delayed 102 in order to compensate the delay introduced by the filter 104. These delays are, for example, of the order of a microsecond. After application of the gain $g_2$, a signal $e_i$ is obtained.

In order to control the analogue gain $g_a$ so as to have a maximum efficiency of the ADC converter, an adaptive gain control AGC loop 118, also called automatic gain control loop, is used. The embodiment presented in FIG. 1 comprises an AGC loop 118. This loop comprises a module 112 for determining the power of the signal at the output of said ADC converter and/or the average of this power, a digital filter 113, a mapping table 114 making it possible to switch to logarithmic scale. The power estimation 112 is performed on the signal $e_i$ obtained after application 106 of the inverse gain $g_2$.

The result obtained after power estimation 112, filtering 113 and conversion 114 is compared 115 to a control set point $g_1$. The difference between the filtered measured power and the set point $g_1$ is used by a corrector 116 to determine the value of the analogue gain $g_a$ to be applied to the variable gain amplifier 100 of the analogue stage 119. The corrector 116 is used to apply a gain to the difference mentioned previously then to power an infinite integrator, which is never reset to zero. The choice of the control set point $g_1$ depends on the value of the optimum efficiency for the conversion. The choice of the corrector gain determines the time constant of the AGC loop.

Advantageously, the power inversion, that is to say the implementation of an inversion relationship between the power at the input and the power at the output, is performed in the time domain. This makes it possible to weight the signal e which enters into the receiver progressively as a function of its quality and enables the AGC loop 118 to be locked naturally on a received signal level close to the floor level corresponding to the level of background noise excluding interference.

Furthermore, unlike the temporary signal cancellation technique, it is no longer necessary to determine a priori a cancellation threshold for cancelling signal portions, which avoids the risk of divergence of the AGC loop in the case of excessively frequent interference pulses.

The bits at the output of the power inversion module 117 can be rescaled 107, that is to say coded on a smaller number M of bits, the rescaling operation usually being referred to as "bit rescaling". The duly digitized and rescaled signal is then used to demodulate the radionavigation signals borne by the signal e in the demodulation channels 108, 109, 110, 111. As an example, the GNSS systems usually use wideband signals generated onboard satellites by using the technique of spectrum spreading by spreading code modulating a carrier. In this case, each demodulation channel of the receiver is associated with a spreading code specific to a satellite.

Thus, the system according to the invention limits the impact of the interferences by implementing a power inversion while using a modified AGC loop, the input signal of which is taken after application of the power inversion gain $g_2$.

Figure 2:
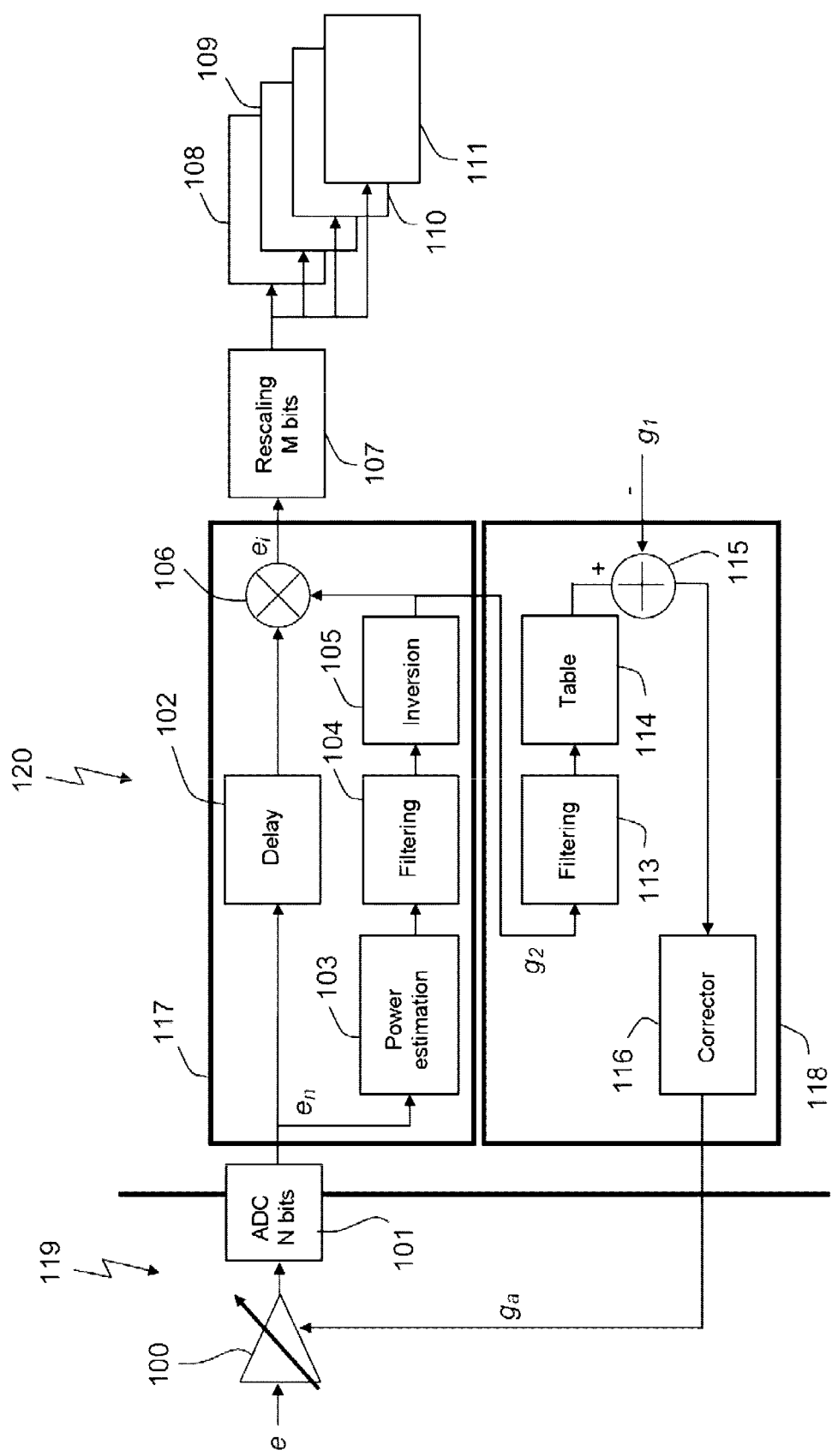
FIG. 2 illustrates a second embodiment of the reception according to the invention.

FIG. 2 illustrates a second embodiment of the reception system according to the invention. The elements of the reception system bearing the same reference as for FIG. 1 are identical.

This second embodiment differs from the first embodiment in that the power inversion gain $g_2$ is used directly as input for the AGC loop. This makes it possible to avoid calculating the power at the input of said loop and thus to simplify its operation.

Figure 3:
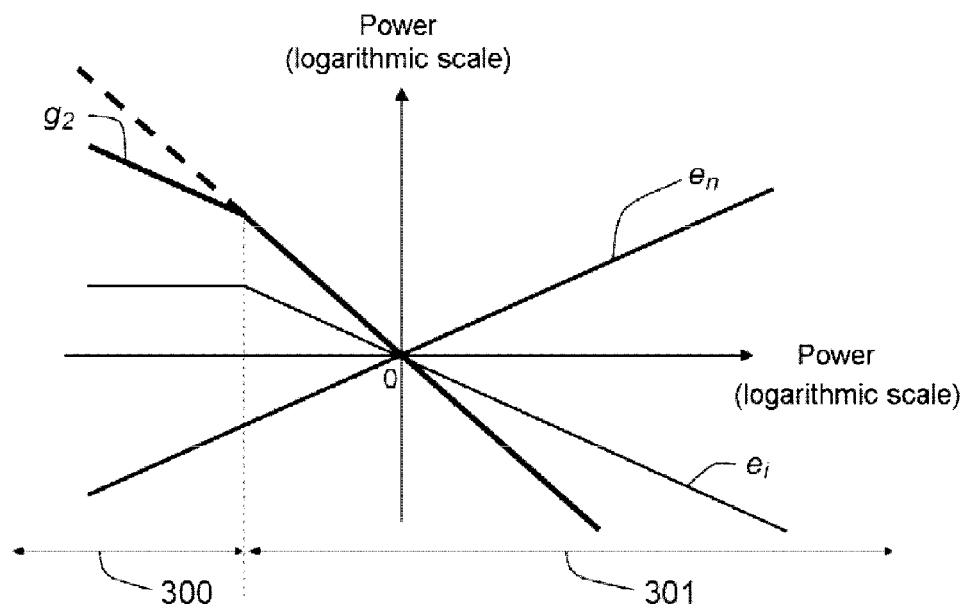
FIG. 3 illustrates how the inversion gain $g_2$ can be determined.

FIG. 3 illustrates how the inversion gain $g_2$ can be determined. The relationships between the powers of the digitized input signal $e_n$, of the inverted signal $e_i$ and the inversion gain $g_2$ are represented graphically, the X and Y axes representing powers on a logarithmic scale. Advantageously, the relationship between the power of the digitized signal $e_n$ and the power of the inverted signal $e_i$ may be different according to the measured values of the power $e_n$. Thus, over a first power range 300, a first gain profile $g_2$ can be used and, over a second range 301, a second gain profile $g_2$ can be used. In other words, the slope of the inversion gain $g_2$ is modified in order to limit the power of the inverted signal $e_i$. As an example, on the first portion 300, a slope −1 on logarithmic scale is associated with the first profile of $g_2$ and, on the second portion 301, a slope −2 on logarithmic scale is associated with the second profile of $g_2$. This modification of the slope corresponds to a modification of the relationship between the estimation of the power of the signal $e_n$ and the inversion gain $g_2$ for the lowest values, that is to say for the first range 300. This is equivalent, in linear scale, to implementing a tabulated square root law after inversion of the filtered estimated power.

Figure 4:
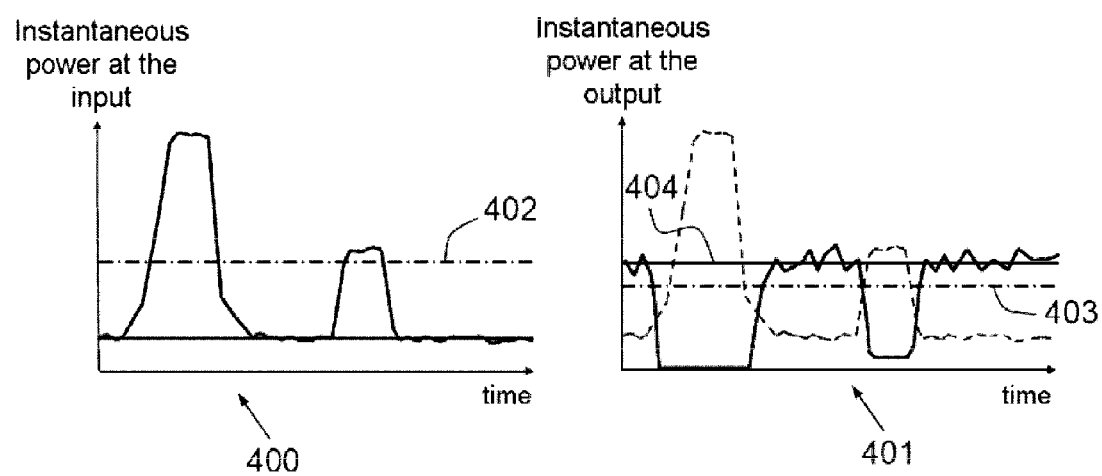
FIG. 4 presents examples of measurements of the instantaneous power before and after power inversion.

FIG. 4 presents examples of measurements of the instantaneous power before and after the power inversion processing operation. Before power inversion 400, the power of the signal $e_n$ varies significantly in the presence of pulsed interferences. These variations affect the estimated average power 402 used by a conventional AGC loop of the prior art. It appears that, after the power inversion 401, the signal $e_i$ has an average power 403 close to the average power of the signal 404 that would be estimated in the absence of interference, and that therefore the AGC loop will not be excessively affected by the interference pulses, at least never to the point of making it diverge.

The inversion of the power between the digitized input signal $e_n$ and the signal after power inversion $e_i$ means that proportionally more weight is given to the sequences of the signal received that are of low power and less weight is given to the sequences of the signal received that are of high power. Now, the component of the received signal comprising the useful information is of constant power and is embedded in the noise and the interferences. This means that where the total power is low, the quality of the received signal is high, that is to say that the signal-to-noise ratio is higher, and vice versa. Thus, the invention implements an intelligent self-adaptive weighting.

The system according to the invention is much less sensitive to the defects of regulation of the signal level by the AGC with regard to signal-to-noise ratio performance. In practice, as in the case of the temporary cancellation technique, there is no fixed threshold to be set a priori relative to the floor signal level, the latter being able to fluctuate because of the imperfections of the AGC loop. The system is therefore more robust against the possible biases of the AGC loop due to pulsed interference. Furthermore, the AGC loop according to the invention is less disturbed by the interference pulses because the average power (403) estimated after the power inversion diverges less from its floor value (404) corresponding to the background noise. There is therefore no longer a risk of making the AGC diverge to the point of rendering the demodulation impossible. In practice, in the calculation of the average power (403) after the power inversion, since much less weight is given to the disturbed signal sequences, a closer approximation to the ceiling average power (404) after the power inversion is obtained than would be obtained in the absence of interference and which corresponds to the background noise alone.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention.

The invention claimed is:

1. A system for receiving an analogue signal e comprising means for amplifying and digitizing said signal in order to obtain a digitized signal $e_n$;
a power inversion module, which reduces the impact of pulsed interference on the signal to be demodulated, said module determining a power inversion gain $g_2$, this gain being applied to the digitized signal $e_n$; and
an automatic gain control (AGC) loop adapting the power of the signal e before digitization, wherein the input signal of the AGC loop is a function of the power inversion gain $g_2$.

2. The system according to claim 1, in which the input signal of the AGC loop is a signal $e_i$ obtained after application of the power inversion gain $g_2$.

3. The system according to claim 1, in which the input signal of the AGC loop is the power inversion gain $g_2$ determined by the inversion module.

4. The system according to claim 1, wherein the system is configured to receive satellite signals of GNSS type.

5. The system according to claim 1, wherein the inversion module estimates the power of the digitized signal $e_n$, filters the estimated power, and inverts the filtered estimated power in order to obtain the gain $g_2$ applied to the digitized signal $e_n$.

6. The system according to claim 5, where the inversion gain $g_2$ is applied to a delayed version of the digitized signal $e_n$, said signal being delayed in order to compensate for a delay introduced by the filtering.

7. The system according to claim 1, where an inversion relationship between the filtered estimated power of the digitized signal $e_n$ and the inversion gain $g_2$ differs according to the measured values of the power $e_n$.

8. The system according to claim 7, wherein a first profile of inversion gain $g_2$ is used for a first range of power values, and a second profile of inversion gain $g_2$ is used for a second range of power values.

* * * * *